United States Patent [19]

Carter

[11] 4,288,875
[45] Sep. 8, 1981

[54] CONTROLLED LOCAL OSCILLATOR WITH APPARATUS FOR EXTENDING ITS FREQUENCY RANGE

[75] Inventor: George W. Carter, Greenfield, Ind.

[73] Assignee: RCA Corporation, New York, N.Y.

[21] Appl. No.: 119,991

[22] Filed: Feb. 8, 1980

[51] Int. Cl.³ .................. H04B 1/26; H03B 5/12
[52] U.S. Cl. .................. 455/197; 331/177 V; 455/318
[58] Field of Search ............. 455/142, 150, 169, 180, 455/188, 191, 193, 195–197, 318; 331/177 R, 177 V; 334/15

[56] References Cited

U.S. PATENT DOCUMENTS

| | | | |
|---|---|---|---|
| 2,950,385 | 8/1960 | Yasuda et al. | 455/197 |
| 3,029,339 | 4/1962 | Pan | 455/195 |
| 3,103,637 | 9/1963 | Pan | 331/177 V |
| 3,370,254 | 2/1968 | Keller | 331/177 V |
| 3,617,899 | 11/1971 | Goncharoff et al. | 455/195 |
| 4,146,850 | 3/1979 | Fache et al. | 331/177 V |

OTHER PUBLICATIONS

RCA Service Data, File 1979 C-6, P34–Frequency Synthesis Tuner Schematic.

Primary Examiner—Marc E. Bookbinder
Attorney, Agent, or Firm—E. M. Whitacre; P. J. Rasmussen; P. M. Emanuel

[57] ABSTRACT

A tuner for a television receiver includes a voltage controlled local oscillator for tuning VHF channels comprising a transistor arranged in a common base amplifier configuration and a parallel tuned circuit including a varactor diode responsive to a tuning voltage and a first inductor configuration for the low VHF band and a second inductor configuration for the high VHF band connected between the collector and emitter electrodes of the transistor. A second varactor diode also responsive to the tuning voltage is connected between the emitter and base electrodes of the transistor to expand the range of the local oscillator in its high VHF configuration to permit tuning of channels in a midband cable band between the low and high VHF bands without the need for a third inductor configuration.

4 Claims, 1 Drawing Figure

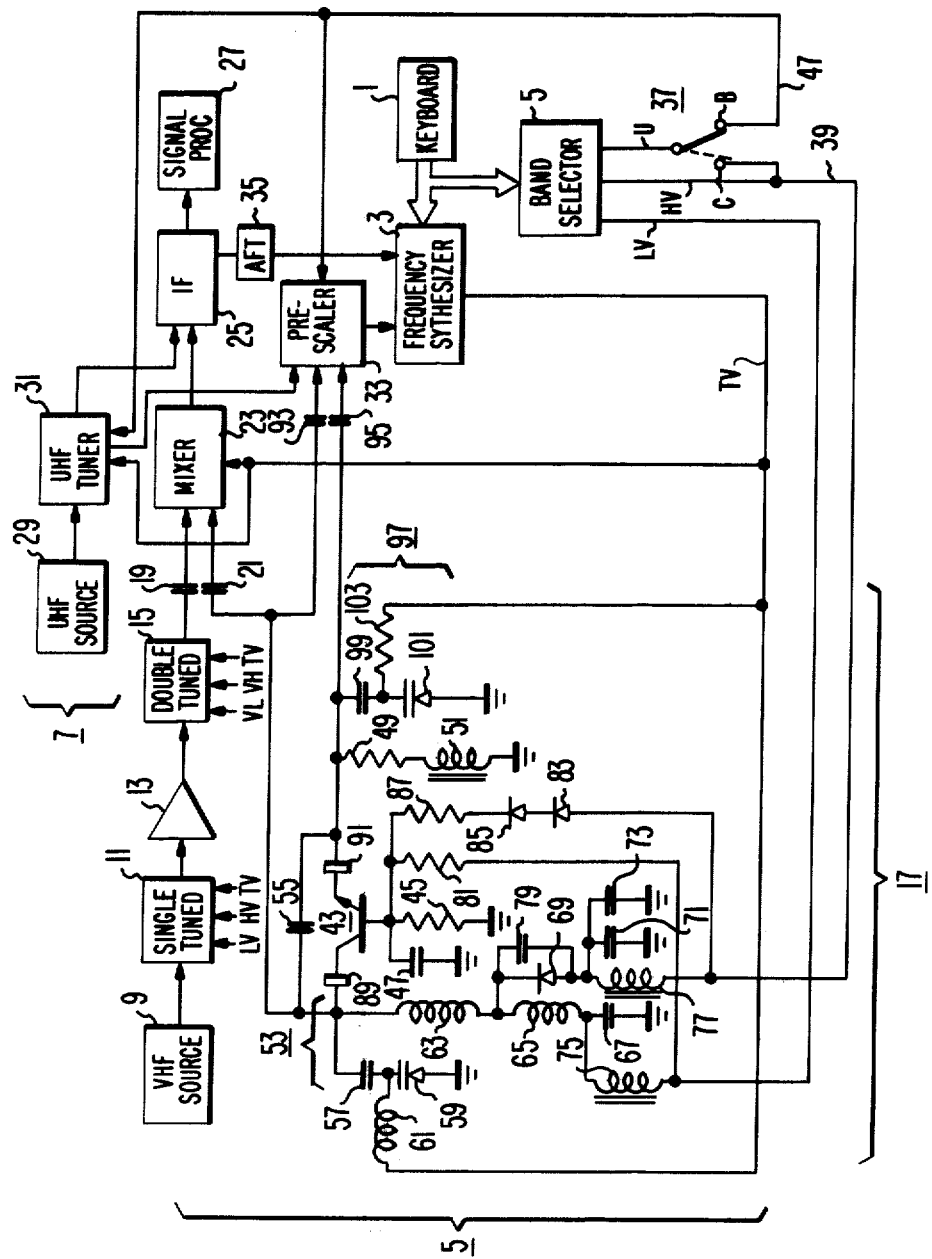

CONTROLLED LOCAL OSCILLATOR WITH APPARATUS FOR EXTENDING ITS FREQUENCY RANGE

ENVIRONMENT OF THE PRESENT INVENTION

The present invention concerns a circuit for extending the range of a controlled oscillator.

Voltage controlled tuners are widely employed in radio and television receivers. They include an RF input section and a local oscillator, each including respective frequency selective circuitry controlled in response to a tuning voltage. Typically, the frequency selective circuitry includes at least one fixed inductor and a voltage variable capacitance element, such as a varactor diode, arranged to form a tuned circuit. In response to the tuning voltage, the RF input section selects the one of a plurality of received RF carriers corresponding to a selected station and the local oscillator generates a local oscillator signal having a predetermined frequency associated with the selected channel. The selected RF carrier and local oscillator signal are heterodyned by a mixer to produce an IF signal which, e.g., in a television receiver is processed by the receiver to produce audio and visual responses.

The television range includes several separated frequency bands. For example, in the United States, the television range includes a low VHF range for channels 2 through 6, a high VHF range for channels 7 through 13, and a UHF range for channels 14 through 83. In a typical television tuner there are separate tuner sections, each including an RF section and a local oscillator, for the VHF and UHF bands. The capacitance range of varactor diodes is not, in general, large enough to enable a tuned circuit in which it is included to be tuned over the entire VHF Range. As a result, it is typical that the tuned circuits in the RF section and local oscillation of a voltage controlled television tuner each include circuitry for selecting a different inductor configuration for each of the low VHF and high VHF bands.

With the ever increasing availability of cable television networks, television receiver manufacturers have begun to incorporate circuitry for receiving cable carriers in television tuners. Depending on the cable bands to be tuned, this may require the addition of tuned circuit configurations in both the RF section and local oscillator which are selected when a cable channel is selected. It may also require that tuning circuitry intended for tuning broadcast carriers have its tuning range expanded to enable the tuning of cable carriers. The latter becomes particularly important when it is desired to accommodate the tuning of cable channels without the addition of additional tuned circuit configurations.

The extension of the tuning range of a local oscillator is particularly difficult because of the criticality of the conditions that must be established for oscillation to occur. In simple terms, an oscillator includes an amplifier having a frequency determining network and a feedback path between an output point and an input point of the amplifier configured to form a regenerative amplification network for frequencies determined by the frequency determining network. Typically the voltage controlled oscillators utilized in a television receiver include a transistor amplifier and a frequency determining network comprising an inductor and a varactor diode in either a series or parallel configuration.

In practicality, the individual elements of an oscillator are complex, including resistive, capacitive and inductive components. As the frequency of oscillation is changed, the relationship between the various components changes, causing the conditions for oscillation to be disturbed. For example, as the capacitance of a varactor diode increases, its resistive component is more closely coupled with other components of the oscillator. This may manifest itself as loss causing the reduction of the amplitude of signal available to be fed back between output and input. In U.S. Pat. No. 3,370,254, entitled "Transistorized Voltage Tunable Oscillator," issued in the name of Keller on Feb. 20, 1968, circuitry is disclosed for compensating for such varactor diode losses in a voltage controlled oscillator comprising a transistor arranged in a common base configuration and a tuned circuit including an inductor and a varactor diode responsive to a tuning voltage connected in parallel to the collector of the transistor. It is taught that compensation is achieved by increasing the feedback between the collector and emitter of the transistor by means of a second varactor diode also responsive to the tuning voltage connected between the collector and emitter.

While such an arrangement operates as one would expect to compensate for losses of a voltage variable tuned circuit by increasing the feedback between an output point to which the voltage variable tuned circuit is connected and an input point, it may not satisfy the oscillation conditions necessary for an extended range of other oscillator configurations or similar oscillator configurations operating in different frequency ranges. Moreover, since the varactor diode in the variable feedback path is connected to the same point to which the tuned circuit is connected, the oscillator may be detuned because of it. This is particularly undesirable in a tuner including a number of tuned stages in the RF section which must track as closely as possible tuning changes in local oscillator.

SUMMARY OF THE PRESENT INVENTION

The present invention concerns apparatus for extending the frequency range of an oscillator controlled in response to the magnitude of a tuning signal including an amplifier having first, second and common terminals; a tuned circuit including a first reactance element controlled in response to the tuning signal connected between a first one of the terminals and common terminal; and a feedback path connected between the first and second terminals. According to the present invention, a second reactance element also controlled in response to the tuning signal is connected between the second one of the terminals and the common terminal rather than between the first and second terminals to maintain the conditions required for oscillation over the extended frequency range. In a preferred embodiment, voltage variable diodes comprise each of the two reactance elements and are controlled in the same sense as a function of the magnitude of the tuning signal. In this embodiment, while it would appear that the second voltage variable capacitor would decrease rather than increase feedback signals between the first and second terminals and thereby not operate to extend the frequency range of the oscillator, it has been found that the opposite is true. Moreover, it has been found that the amount of detuning exhibited by the tuned circuit due to the second reactance element is inconsequential in the frequency range of interest. As a result, the present arrangement is particularly desirable for use in a voltage controlled tuner including several tuned circuits in a RF section which must track as closely as possible frequency variations of the local oscillator signal.

BRIEF DESCRIPTION OF THE DRAWING

The drawing includes a sole FIGURE which is a schematic, partially in block form, of a voltage controlled tuning system employing a VHF oscillator constructed in accordance with the present invention.

DETAILED DESCRIPTION OF THE DRAWING

In the television receiver shown in the sole FIGURE, channels are selected by sequentially depressing the two keys or buttons of a calculator-like keyboard 1 representing the tens and units digit of the corresponding channel number. In response, keyboard 1 sequentially generates groups of binary signals representing in binary coded decimal format the tens and units digits of the channel number of the selected channel. The binary signals are applied to a frequency synthesizer 3 and a band selector 5. Frequency synthesizer 3 converts the binary signals into a tuning voltage. Band selector 5 generates band selection signals representing the frequency bands of the selected channel, i.e., a LV signal for the VHF channels between 2 and 6, a HV signal for the VHF channels between 7 and 13, and a U signal for the UHF channels between 14 and 83. A tuning system, including a frequency synthesizer comprising a phase locked loop and provisions for generating band selection signals, suitable for use in the television receiver shown in the sole FIGURE is disclosed in U.S. Pat. No. 4,031,549 entitled "Television Tuning System with Provisions for Receiving RF Carriers at Nonstandard Frequencies," issued in the name of Rast et al on June 21, 1977, and assigned, like the present application, to RCA Corporation, which patent is incorporated by reference.

The tuning voltage and the band selection signals are applied to a VHF tuning section 5 and a UHF tuning section 7. VHF tuning section 5 is activated in response to either of the LV or HV band selection signals. UHF tuning section 7 is activated in response to the U band selection signal.

VHF tuning section 5 receives RF signals in the VHF range from a VHF signal source 9 such as an antenna or cable network. The RF signals are filtered by a voltage controlled single-tuned filter circuit 11, amplified by an amplifier 13 and again filtered by a voltage controlled double tuned filter circuit 15 to select the one of RF signals corresponding to the selected channel. A voltage controlled VHF local oscillator 17 generates a local oscillator signal having a predetermined frequency corresponding to the selected channel. The selected RF signal and the local oscillator signal are applied through respective capacitors 19 and 21 to a mixer 23 where they are heterodyned to generate an IF signal. The IF signal is filtered and amplified by an IF section 25 and then applied to a picture and sound signal processing section 27.

To enable the entire VHF range to be tuned, single-tuned filter circuit 11, double-tuned filter circuit 15 and local oscillator 17 include different tuned circuit configurations for each of the low VHF band and the high VHF bands. Specifically, the tuned circuit or circuits (double-tuned circuit 15 includes two) of units 11, 15 and 17 each include a single varactor diode in essentially a parallel combination with a different inductor configuration selected in response to respective ones of the LV and HV band selection signals.

Single-tuned circuit 11, amplifier 13, double-tuned circuit 15 and mixer 23 may be constructed in a manner similar to the corresponding portions of the VHF tuning section employed in a CTC-99 color television receiver manufactured by RCA Corporation, Indianapolis, Ind., and disclosed in RCA Television Service Data File 1979 C-6 also published by RCA Corporation, Indianapolis, Ind.

UHF tuning section 7, including a UHF signal source 29 and a UHF tuner 31, is functionally organized in a manner similar to that of VHF tuning section 5 to generate an IF signal and will not be described in detail since the present invention primarily concerns VHF tuning section 5.

The tuning voltage is generated in the following manner. Each of the local oscillator signals generated in VHF tuning section 5 and UHF tuning section 7 are applied to a prescaler or frequency divider 33. When a VHF channel is selected, in response to the absence of a U band selection signal, prescaler 33 divides the frequency of the VHF local oscillator signal by a first factor, e.g., 64, selected to accommodate the frequency range of frequency synthesizer 3. When a UHF channel is selected, in response to the presence of a U band selection signal, prescaler 33 divides the frequency of the UHF local oscillator signal by a second predetermined factor, e.g., 256, which is selected four times greater than the first predetermined factor since UHF local oscillator signals have frequencies four times higher than the frequencies of VHF local oscillator signals. Such a prescaler is disclosed in U.S. Pat. No. 4,127,820 entitled "Electrical Circuit For Multiplexing and Dividing Different Bands or Frequencies," issued in the name of Beelitz et al on Nov. 28, 1978, and also assigned to RCA Corporation, which is hereby incorporated by reference.

The output signal of prescaler 33 is applied to frequency synthesizer 3 where, as described in detail in the aforementioned Rast et al patent, it is further divided by a programmable factor directly proportional to the frequency, in MHz, of the local oscillator signal required to tune the selected channel. The resultant frequency divided local oscillator signal is compared to a reference frequency signal to generate a pulse error signal representing the sense and magnitude of the frequency deviation of the frequency divided local oscillator signal from the reference frequency signal. The error signal is filtered to derive the tuning voltage. To accomodate frequency offsets of RF input signal, after the frequency deviation of the frequency divided local oscillator signal from the reference frequency signal reaches a predetermined limit at which the phase locked loop is said to be locked, frequency synthesizer 3 disables the phase locked loop and derives the tuning voltage from an automatic fine tuning signal representing the frequency deviation of a picture carrier of the IF signal from a nominal value, e.g., 45.75 MHz, generated by an automatic fine tuning discriminator 35.

A switch 37 is provided to enable midband cable as well as broadcast carriers to be tuned. In a broadcast position (B) of switch 37 the VHF tuning section 5 and UHF tuning section 7 operate as described above. In a cable position (C) of switch 37, the U band selection signal is applied to HV control line 39 rather than to U control line 47. As a result, portions of the tuned circuit configurations for the high VHF band of VHF tuning section 5 are enabled to operate rather than UHF tuning section 7 when a UHF channel is selected. In addition, since the U band selection signal is not applied to prescaler 33, prescaler 33 divides by the first predetermined factor associated with VHF channels rather than the second predetermined factor associated with UHF channels. Under these conditions, the tuning voltages for the midband cable channels are obtained when corresponding UHF channel numbers are entered by means of keyboard 1. Since the division factors of the phase locked loop of frequency synthesizer 3 are selected for the broadcast channels rather than for the cable channels, the phase locked loop may not provide the precise local oscillator frequency for the cable channels. However, any frequency discrepancy is minimized after the phase locked loop configuration is locked since thereafter the tuning voltage is derived in response to the AFT signal.

The following table indicates cable channels which may be tuned, the desired local oscillator frequency, the channel number which should be selected for the cable channel, and the local oscillator frequency provided by the phase locked loop of frequency synthesizer 3. It is noted that since prescaler 33 divides by 64 rather than by 256 when switch 37 is in the cable position, the local oscillator frequency provided by the phase locked loop will be four times less than the nominal local oscillator frequency for the respective UHF channel.

| CABLE CHANNEL | DESIRED LO FREQ. (In MHz) | CHANNEL NUMBER | UHF LO FREQ. (In MHz) | PLL LO FREQ. (In MHz) |
| --- | --- | --- | --- | --- |
| A-2 | 155 | 31 | 619 | 154.75 |
| A-1 | 161 | 35 | 643 | 160.75 |
| A | 167 | 39 | 667 | 166.75 |
| B | 173 | 43 | 691 | 172.75 |
| C | 179 | 47 | 715 | 178.75 |
| D | 185 | 51 | 739 | 184.75 |
| E | 191 | 55 | 763 | 190.75 |
| F | 197 | 59 | 787 | 196.75 |
| G | 203 | 63 | 811 | 202.75 |
| H | 209 | 67 | 835 | 208.75 |
| I | 215 | 71 | 859 | 214.75 |

The local oscillator frequency range for broadcast channels in the high VHF band extends from 221 MHz for channel 7 to 257 MHz for channel 13. The local oscillator frequency range for broadcast channels in the low VHF band extends from 101 MHz for channel 2 to 129 MHz for channel 6. The local oscillator frequency range for the midband cable channels is just below the high VHF band. To ensure that all the midband cable channels as well as the high VHF broadcast channels can be tuned, with allowances for possible frequency offsets of the picture carrier, without the need for another selectively enabled inductor configuration, requires that the oscillation range of the high VHF configuration of VHF local oscillator 17 be expanded by about 180 percent from a range in which the ratio between the high and lowest frequencies of interest is about 1.2 to a range in which the ratio between highest frequency and lowest frequency is about 1.7.

The relationships between components of the high VHF configuration of conventional VHF local oscillator 17 are selected to establish the proper conditions for oscillation in the high VHF broadcast band. Unfortunately, the relationships selected for the high VHF broadcast band may not be proper to establish the proper conditions for oscillation in the midband cable band. Under such circumstances, VHF oscillator 17 may cease to oscillate or may oscillate so weakly that a local oscillator signal of insufficient amplitude to permit the proper operation of other parts of the tuning system such as mixer 23 or prescaler 33 is generated. Accordingly, VHF local oscillator 17 includes circuitry described in detail below for modifying the relationships established for the high VHF broadcast band as a function of frequency as manifested tuning voltage to maintain the proper conditions for oscillation throughout the midband cable band.

(While the high VHF configurations of single-tuned circuit 11 and double-tuned circuit 15 must also be capable of being tuned throughout an expanded range to accommodate the tuning of midband cable channels, this does not present significant difficulty since critical conditions, such as those required to establish oscillation, need not be maintained.)

VHF local oscillator 17 includes a NPN transistor 43 configured in a common base amplifier configuration. A base bias resistor 45 is connected between the base electrode of transistor 43 and signal ground. A capacitor 47 is connected in parallel with resistor 45 and is selected so that it has a relatively low impedance value and thereby effectively by-passes resistor 45 in the VHF band. An emitter bias resistor 49 and an iron core inductor 51 are connected in series between the emitter of transistor 43 and signal ground. Inductor 51 is selected so that it provides a relatively high impedance between resistor 49 and signal ground in the VHF band. A parallel tuned circuit 53 is connected between the collector electrode of transistor 43 and signal ground. A capacitor 55 connected between the collector electrode and the emitter electrode provides a feedback path for the amplifier between the collector and emitter of transistor 43. Although shown as a discrete capacitor, capacitor 55 may comprise the parasitic capacitance between the collector and emitter of transistor 43.

Tuned circuit 53 comprises a fixed capacitor 57 and a varactor diode 59 connected in series between the collector electrode and signal ground. Varactor diode 59 is poled to be reversed biased by the application of the tuning voltage, which is a positive voltage, to the junction of capacitor 57 and varactor diode 59. Under these circumstances, varactor diode 59 exhibits a capacitance inversely related to the magnitude of the tuning voltage. The tuning voltage is applied to varactor diode 59 through an inductor 61 which is selected so that it exhibits a relatively high impedance value in the VHF band. An inductor 63, an adjustable inductor 65 and a capacitor 67 are connected in parallel with the series combination of capacitor 57 and varactor 59 between the collector electrode of transistor 43 and signal ground.

A switching diode is connected in series with two parallel capacitors 71 and 73 between the junction of inductors 63 and 65 and signal ground. Capacitors 71 and 73 are selected so that they provide a relatively low impedance path between the anode of diode 69 and signal ground in the VHF range. The LV band selection signal is applied to the cathode of diode 69 through an iron core inductor 75. The HV band selection signal is applied to the anode of diode 69 through an iron core inductor 77. Inductors 75 and 77 are selected to have relative high impedance values in the VHF band. A capacitor 79 is connected in parallel with diode 69.

When a low VHF channel is selected, band selection signal LV is a relatively high positive voltage, switching diode 69 is reverse-biased and therefore non-conductive. Under these conditions the frequency response of tuned circuit 53 depends on capacitor 57, varactor diode 59, inductor 63, inductor 65, capacitor 67 and capacitor 79. When a high VHF or midband cable channel is selected, band selection signal HV is a relatively high positive value, switching diode 69 is forward biased and conductive. Under these conditions the frequency response of tuned circuit depends on capacitor 57, varactor diode 59 and inductor 63.

The LV band selection signal is applied to the base of transistor 43 through a resistor 81. The HV band selection signal is applied to the base of transistor 43 through the series path including voltage dropping diodes 83 and 85 and a resistor 87. The values of resistors 81 and 87 are selected so that the voltage applied to the base of transistor for high VHF and midband cable channels is higher than the voltage applied to the base of transistor for low VHF channels. As a result, the emitter current and input power are higher for high VHF and midband cable channels than for low VHF channels. This tends to compensate for the reduction in efficiency of transistor 43 at high VHF and midband cable frequencies.

A ferrite bead 89 surrounds the lead coming from the collector electrode of transistor 43. Bead 89 inhibits undesired oscillations due to parasitic components associated with the collector electrode. Another ferrite bead 91 surrounds the lead coming from the emitter electrode. Bead 91 tends to limit the amplitude of excessively high amplitude voltages that may be developed at the emitter of transistor 43 at relatively high frequencies in a band, e.g., such as 129 MHz for channel 6, which may otherwise cut off transistor 43 and thereby undesirably add distortion to the local oscillator signal.

Prescaler 33 includes differential stages which are desirably driven by opposedly phased input voltages when the amplitude of the signal input is low. Accordingly, the voltages developed at the collector and emitter electrodes of transistor 43, which are opposedly phased, are applied through respective capacitors 93 and 95 to input terminals of prescaler 33. Since the collector voltage has a greater amplitude than the emitter voltage, capacitor 93 is selected to have a smaller value than capacitor 95 so as to equalize the input signals to prescaler 33.

As explained above, since the capacitance range of a varactor diode is limited to enable VHF local oscillator 17 to tune both the low and high VHF channels, tuned circuit 53 is reconfigured by selectively enabling two different inductor configurations in response to band selection signals LV and HV as described above. A third selectively enabled inductor configuration may be provided to enable VHF local oscillator 17 to also tune midband cable channels.

However, in the present arrangement, the same tuning capability is provided without the addition of a selectively enabled third inductor configuration by means of network 97. Network 97 extends the range of the high VHF configuration of VHF local oscillator 17 through the midband cable frequency range by maintaining the conditions necessary for oscillation which would otherwise be disturbed.

The components of VHF oscillator 17 so far described are selected to establish the proper conditions for oscillations throughout the low VHF and high VHF bands. The conditions for oscillation are that the common base amplifier provide a gain greater than unity between its input at the emitter electrode and its output at the collector electrode and that the phase shift between the input and output due to transistor 43 and the phase shift provided by feedback capacitor 55 in association with the collector and emitter circuitry combine to provide a total loop phase shift of zero degrees. In this configuration, a regenerative loop is formed in which a small signal variation at any point is repetitively amplified until the saturation and cutoff characteristics of transistor 43 limit the amplitude achieved. Tuned circuit 53 extracts the desired frequency component from the resultant loop signal.

As the frequency of oscillation is decreased by decreasing the magnitude of the tuning voltage to increase the capacitance of varactor diode 59, several mechanisms disturb the phase shift conditions necessary for oscillation. E.g., as the capacitance of varactor diode 59 increases, the phase shift provided by the combination of its inherent series resistance (not shown) and its capacitance changes. In addition, the parasitic elements of transistor 43 influence the phase shift associated with transistor 43 differently in the midband cable band than in the high VHF band.

To compensate for such phase shift changes to maintain the proper conditions for oscillation, it has been found necessary to increase the capacitance between the emitter electrode and signal ground as the frequency of oscillation decreases. This is accomplished by network 97 which includes a capacitor 99 and a varactor diode 101 connected in series, in the order named, between the emitter electrode of transistor 43 and signal ground. Tuning voltage is applied to the junction of capacitor 99 and varactor diode 101 through a resistor 103. Varactor diode 101 is poled so that as the magnitude of the tuning voltage is decreased, its capacitance increases. Capacitor 99 and varactor diode 101 are selected so that the capacitance due to their combination is negligible at the highest frequency, i.e., 257 MHz, in the high VHF band.

It has been found that the amount of detuning of VHF local oscillator 17 due to varactor diode 101 is negligible. This results because varactor diode 101 is isolated from tuned circuit 53 by the combination of transistor 43, capacitor 55 and capacitor 99. This is particularly desirable since the tuning of VHF local oscillator 17 should track as closely as possible the tuning of single-tuned circuit 11 and double-tuned circuit 15.

Since the amplitude of the local oscillator signal decreases as the capacitance of varactor diode 59 in tuned circuit 53 increases, the amplitude of the local oscillator signal is lower at the lowest frequency in a tuning band than at the highest frequency in the tuning band. This condition is particularly critical in the low VHF band because the capacitance of varactor diode 59 required for channel 2 is very low. As earlier noted, the operation of portions of the tuning system such as mixer 23 may be adversely affected by local oscillator signals having a relatively low amplitude. Accordingly, it has been found helpful in the past to increase the gain of the mixer as an inverse function of the magnitude of the tuning voltage in the manner disclosed in the aforementioned RCA Service Data. This may as well be accomplished by increasing the amplitude of the injection signal applied to the mixer by the local oscillator as an inverse function of the magnitude of the tuning voltage, e.g., by employing a varactor diode responsive to the tuning voltage connected between the local oscillator and the mixer in the manner disclosed in U.S. Pat. No. 4,160,313 entitled "Mixer Injection Voltage Compensation Circuit," issued in the name of the same inventor as the present invention on July 3, 1979, and also assigned to RCA Corporation.

Network 97 tends to reduce the amount that the amplitude of local oscillator 17 is reduced as a function of frequency. Accordingly, the above-described provisions for compensating for the reduction of the amplitude of the local oscillator signal may not be necessary at least for the low VHF band. However, in the extended high VHF range it may be desirable to aid the beneficial effects of network 97 by employing such aforementioned provisions to compensate for the relatively low amplitude of the local oscillator signal applied to mixer 23 at the lowest midband cable frequency, i.e., 155 MHz.

Typical values or manufacturer part numbers for various components and voltages of VHF local oscillator are identified in the following table.

| Component | Value/Part Number |
| --- | --- |
| capacitor 21 | 2.2 picofarads |
| transistor 43 | Motorola MPSH-11 die EL-219 |
| resistor 45 | 390 ohms |
| capacitor 47 | 1,000 picofarads |
| resistor 49 | 1,000 ohms |
| inductor 51 | 10 microhenries |
| capacitor 55 | 4.7 picofarads |
| capacitor 57 | 39 picofarads |
| varactor diode 59 | ITT BB 329 |
| inductor 61 | 0.7 microhenries |
| inductor 63 | 25-30 nanohenries |
| inductor 65 | 100 nanohenries |
| capacitor 67 | 120 picofarads |
| capacitor 71 | 1,000 picofarads |
| capacitor 73 | 1,000 picofarads |
| inductor 75 | 10 microhenries |
| inductor 77 | 10 microhenries |
| capacitor 79 | 6.8 picofarads |
| resistor 81 | 3,300 ohms |
| resistor 87 | 560 ohms |
| capacitor 93 | 0.22 picofarads |
| capacitor 95 | 0.82 picofarads |
| capacitor 99 | 5.6 picofarads |
| varactor diode 101 | ITT BB 121 |
| resistor 103 | 470 kilohms |
| LV band selection signal | +18 volts |
| HV band selection signal | +18 volts |

While the present invention is particularly useful for extending the range of a voltage controlled VHF local oscillator to enable it to be used to tune midband cable channels without an inductor configuration which is selectively enabled when a midband cable channel is selected, the present invention is generally useful for extending the range of a voltage controlled oscillator. Thus, the present invention may be employed in a voltage controlled oscillator in which different inductor configurations are selectively enabled for respective bands to ensure its oscillation throughout any or all of the bands. Such and other modifications are intended to be included within the scope of the present invention as defined by the following claims.

What is claimed is:

1. In a tuner for tuning channels in a predetermined range of frequencies, apparatus comprising:

channel selection apparatus for generating a tuning voltage having magnitudes corresponding to selected channels;

a local oscillator for generating a local oscillator signal including a transistor having base, collector and emitter electrodes configured as a common base amplifier, said base electrode being connected to a reference potential point; a first varactor diode responsive to said tuning voltage and at least one inductor configuration connected in a parallel combination between said collector electrode and said reference potential point; and feedback means, including a capacitor connected between said collector and emitter electrodes, for conditioning said oscillator to oscillate at a frequency substantially determined by said tuned circuit in at least a portion of said predetermined range;

RF means for receiving a plurality of RF signals and including filter means controlled in a tracking relationship with said tuned circuit means in response to said tuning voltage for selecting one of said RF signals in accordance with the magnitude of said tuning voltage;

mixer means responsive to said local oscillator signal and to a selected one of said RF signals for generating an IF signal; and extension means, including a second varactor diode responsive to said tuning voltage connected between said emitter electrode and said reference potential point, said first and second varactor diodes being poled to exhibit capacitances which change in the same sense in accordance with the magnitude of said tuning voltage, for conditioning said oscillator to oscillate at a frequency substantially determined by said tuned circuit throughout another portion of said predetermined range in accordance with the magnitude of said tuning voltage.

2. The apparatus recited in claim 1 wherein:

said channel selection means includes band selection means for generating a first band selection signal when a channel in a first band of frequencies in said predetermined range is selected and a second band selection signal when a channel in a second band of frequencies in said predetermined range is selected; and switch means for causing said second band selection signal to be generated when a channel in a third band of frequencies between said first and second bands is selected;

said tuned circuit includes a first inductor configuration selectively enabled in response to said first band selection signal; and a second inductor configuration selectively enabled in response to said second band selection signal; and said extension means conditions said oscillator to oscillate in said third band when said second band selection signal is generated.

3. The apparatus recited in claim 2 wherein:

said first inductor configuration is selected for a low VHF band, said second inductor configuration is selected for a high VHF band.

4. The apparatus recited in claim 3 wherein:

said local oscillator further includes a first resistive element and a second capacitor connected in parallel between said base electrode and said reference potential point, said second capacitor being selected to effectively bypass said first resistive element in said predetermined range; bias means for applying at least one bias voltage to said base electrode in conjunction with said first resistive element; a second resistive element and an inductor connected in series between said emitter electrode and said reference potential point, said inductor being selected to effectively decouple said second resistive element from said reference point in said predetermined range.

* * * * *